United States Patent [19]

Grote et al.

[11] Patent Number: 4,641,369
[45] Date of Patent: Feb. 3, 1987

[54] LOCAL OSCILLATOR AND MIXER ASSEMBLY

[75] Inventors: Albert J. Grote, Venice; Raghbir S. Tahim, Buena Park; Kai Chang, Rancho Palos Verdes, all of Calif.

[73] Assignee: TRW Inc., Redondo Beach, Calif.

[21] Appl. No.: 676,324

[22] Filed: Nov. 29, 1984

[51] Int. Cl.$^4$ ............................................... H04B 1/26
[52] U.S. Cl. ................................... 455/327; 455/328; 455/330; 455/325
[58] Field of Search ............... 455/325, 327, 328, 330, 455/317, 326

[56] References Cited

U.S. PATENT DOCUMENTS

| | | | |
|---|---|---|---|
| 4,000,469 | 12/1976 | McMaster | 455/325 |
| 4,392,255 | 7/1983 | Del Giudice | 455/330 |
| 4,406,020 | 9/1983 | Reindel | 455/330 |
| 4,412,354 | 10/1983 | Hu | 455/328 |
| 4,418,429 | 11/1983 | Roberts | 455/328 |

Primary Examiner—Robert L. Griffin
Assistant Examiner—Elissa Seidenglanz
Attorney, Agent, or Firm—Noel F. Heal; Robert J. Stern

[57] ABSTRACT

A radio-frequency mixer and a local oscillator integrated into a single housing, and including a Gunn-type oscillator coupled to the mixer by a section of microstrip transmission line and a section of suspended stripline. A broadside coupler in the suspended stripline provides dc and intermediate-frequency isolation for the mixer, and a block of dielectric material on the microstrip provides improved temperature compensation for the diode oscillator. The entire compact assembly has good conversion loss performance over a relatively wide frequency band, and is relatively insensitive to temperature changes.

11 Claims, 7 Drawing Figures

Q-BAND PERFORMANCE

K-BAND PERFORMANCE

LOCAL OSCILLATOR AND MIXER ASSEMBLY

BACKGROUND OF THE INVENTION

This invention relates generally to radio-frequency (rf) mixers, and more particularly, to rf mixers for use in processing millimeter-wave signals, i.e. signals having a wavelength of the order of a millimeter. A mixer is a device used in communications equipment, and particularly in radio receivers, to convert an rf signal to an intermediate-frequency signal of lower frequency. The mixer heterodynes, or mixes, the rf signal with a different locally generated rf signal, referred to as the local oscillator (LO) signal. The mixer generates signal components both at the sum of the two input frequencies and at the difference of the input frequencies. By means of an appropriate low-pass filter, the difference signal is obtained as the output signal.

For millimeter-wave signals, rf waveguides have been traditionally used to transmit the rf input signals to mixers. Waveguides are basically hollow conductive tubes, usually of rectangular cross section. They transmit and confine electromagnetic energy with relatively low losses, but they are relatively bulky, and correspondingly costly. As communication activities in the millimeter-wave band have increased, there has developed a need in many receiver and communication system applications for a light-weight, low-cost local-oscillator/mixer assembly. Ideally, the assembly should also have good frequency stability, even in varying temperature conditions. In the past, frequency stability has been obtained by means of bulky and expensive phase-locked loop circuits. Other important requirements for a local-oscillator/mixer assembly are a low mixer conversion loss, and a capability of operation over a relatively wide frequency band of rf signals. The present invention meets these requirements and has other advantages that will become apparent from the following summary of the inventive aspects.

SUMMARY OF THE INVENTION

The present invention resides principally in the integration of a local oscillator and a mixer in the same housing the two being coupled together without the use of waveguides, to provide an extremely compact assembly of relatively low cost and good operating characteristics. Briefly, and in general terms, the assembly comprises a conductive housing, oscillator means installed in the housing, an rf mixer installed in the same housing and having an rf input waveguide for coupling an rf signal into the mixer, and transmission line means coupled between the oscillator and the mixer, for transmitting a local oscillator (LO) signal from the oscillator to the mixer and for applying a bias voltage to the oscillator means. Output from the mixer is obtained through an intermediate-frequency output line, which includes low-pass filter means to filter out components other than the desired intermediate frequency.

In the illustrative embodiment of the invention, the transmission line means includes a microstrip transmission line section extending from the oscillator means to a transition point in the transmission line means, and a suspended stripline section extending from the transition point to the mixer. The suspended stripline section also includes a broadside coupler, which makes a transition from one face of the stripline to the other and provides for dc (direct-current) isolation and intermediate-frequency isolation for the mixer. The suspended stripline includes a conductive strip on one side of a stripline substrate of dielectric material. The broadside coupler is a short segment of the stripline at which there is a conductive strip on both faces of the substrate. The local oscillator signal is easily coupled across the substrate at the coupler, but the position of the section is selected in such a manner that it presents an open-circuit condition to intermediate-frequency signals at the mixer. The dc bias voltage applied to the oscillator means is also isolated from the mixer by the coupler.

In the preferred embodiment of the invention, the oscillator means is a Gunn-type diode. The local oscillator portion of the assembly also includes a quarter-wave transformer for impedance matching purposes at the beginning of the microstrip transmission line section, and a stub resonator coupled directly to the Gunn diode. For temperature compensation, the local oscillator also includes a block of dielectric material mounted next to the microstrip conductor to provide a temperature coefficient opposite that of the oscillator. In the illustrative embodiment, a rectangular block of barium tetratitanate is used.

The mixer in the preferred embodiment is a crossbar stripline structure having two beamlead diodes with opposite polarities, connected in series across the broadwall of the reduced height if waveguide. The waveguide is oriented perpendicularly to the suspended stripline section.

It will be appreciated from the foregoing that the present invention represents a significant advance in the field of rf mixer and local oscillator assemblies. In particular, the invention provides such an assembly in a compact and integrated form, without using bulky waveguides to connect the oscillator and mixer. Yet the device has extremely good performance over a wide band of rf frequencies and has good temperature stability. Other aspects and advantages of the invention will become apparent from the following more detailed description, taken in conjunction with the accompanying drawings.

DESCRIPTION OF THE PREFERRED EMBODIMENT

Figure 1:
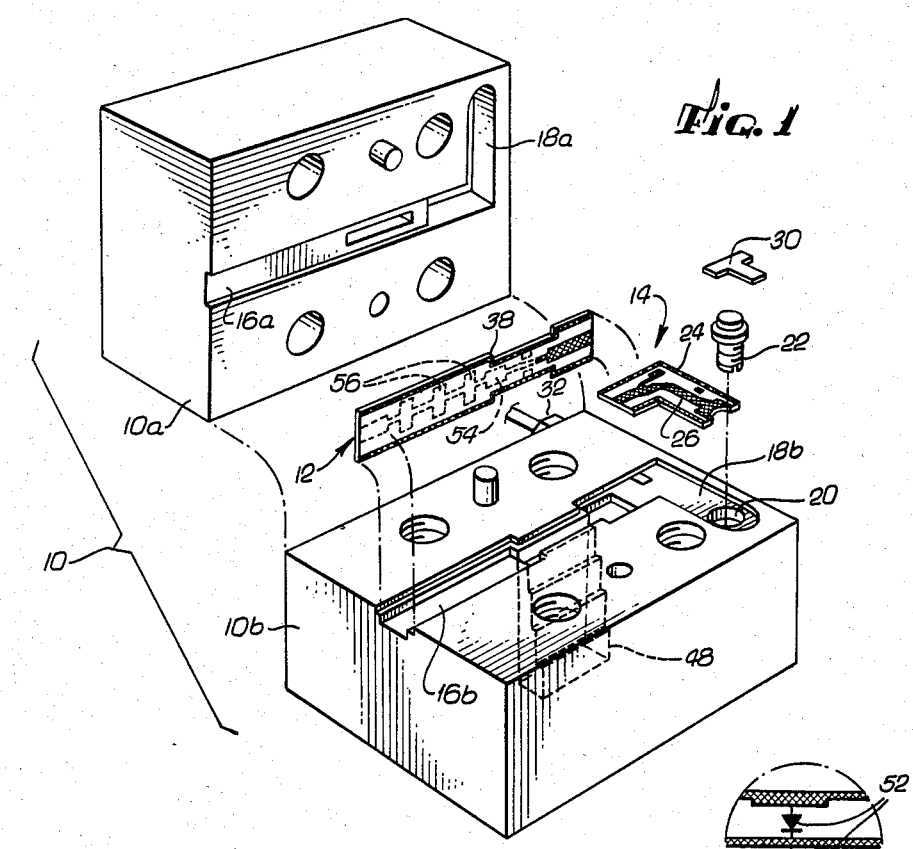
FIG. 1 is an exploded perspective view of a local-oscillator/mixer assembly in accordance with the present invention.

As shown in the drawings for purposes of illustration, the present invention is concerned with radio-frequency (rf) mixers for use at very high frequencies in the millimeter-wave region. The function of a mixer is to heterodyne two signals of different frequencies and produce an output signal at a different frequency. In a radio receiver, a mixer is used to convert a received rf signal to a lower intermediate-frequency signal, by mixing the incoming signal with a local oscillator (LO) signal. Mixing is basically a nonlinear interaction of two input signals. The result of the mixing operation is to produce signal components at both the sum and the difference of the input frequencies. Typically, the frequency difference signal is the one required as the intermediate-frequency signal, and a low-pass filter is employed to filter out the unwanted frequency components.

At the high frequencies with which the invention is concerned, mixers and local oscillators have, prior to this invention, been made as separate components, and both the rf signal and the LO signal have been supplied to the mixer through waveguides. Although waveguides minimize losses, their bulk and cost are practical disadvantages.

In accordance with the present invention, the local oscillator and the mixer are integrated within a single housing, and waveguides are not employed to couple the two together. As shown in FIG. 1, the assembly of the present invention includes a housing block, referred to by reference numeral 10, a section of suspended stripline 12 and a section of microstrip transmission line 14. For convenience, the housing block 10 is fabricated as an upper half 10a and a lower half 10b. The halves 10a and 10b include, in their machine surfaces, a channel 16 of rectangular cross section extending longitudinally across the block, and having an open end 17 at a side face of the block. The respective halves of the channel are referred to by numerals 16a and 16b. Another channel 18, the halves of which are referred to by numerals 18a and 18b, intersects with the channel 16 in an L-shaped configuration.

Figure 4:
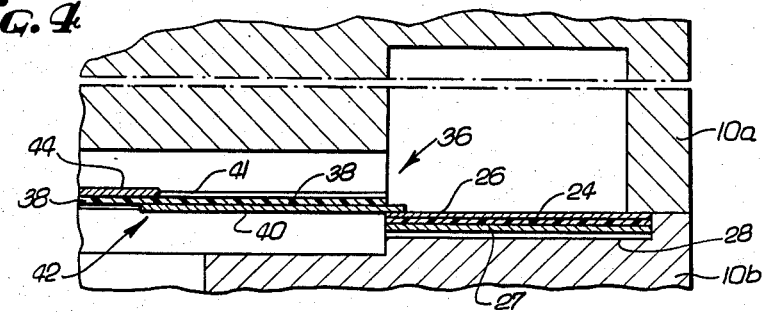
FIG. 4 is an enlarged fragmentary sectional view taken substantially along the line 4—4 of FIG. 2.

At the end of the channel 18 remote from the channel 16b is a threaded hole 20 in which a Gunn diode 22 is installed. The microstrip section 14 is basically L-shaped and is positioned in the channel 18 and in a portion of the channel 16, overlying a portion of the Gunn diode 22. The microstrip section 14 includes a substrate 24 and an overlying conductive strip 26 along the center of the substrate. As best shown in FIG. 4, the microstrip section 14 also includes a metal ground-plane layer 27 on the underside of the substrate 24. The microstrip section 14 is secured to the block half 10b by a layer of solder 28 between the metal layer 27 and the block half 10b. At the end of the microstrip section 14 that is next to the diode 22, the conductive strip includes an integral widened portion 29 that functions as a quarter-wave matching transformer between the Gunn diode 22 and the microstrip. A separate stub resonator 30 takes the form of a generally T-shaped conductive element that is positioned in overlapping relationship with the transformer 29, with the central portion of the T extending over and beyond the top of the Gunn diode 22. The Gunn diode 22 may be any of a number of available devices, such as part number MA 49838 SP-138, manufactured by M/A-Com, of Burlington, Mass.

A bias voltage is applied to the Gunn diode 22 through the conductive strip 26, which also serves, to transmit rf energy from the diode. The bias voltage is applied to the strip 26 through a terminal 32 and a conventional rf assembly 34 used for this purpose. The assembly 34 includes a low-pass filter (not shown) to prevent transmission of rf energy back through the dc power supply connected to the terminal 32.

Figure 2:
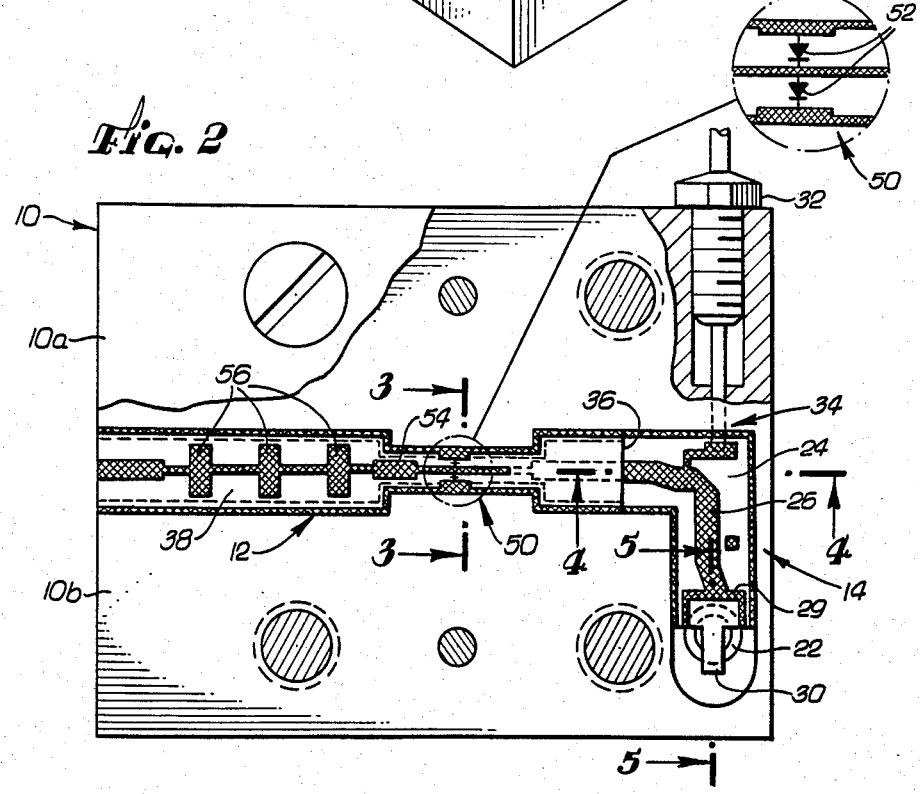
FIG. 2 is an enlarged plan view, partly in section, of the assembly of FIG. 1.
Figure 3:
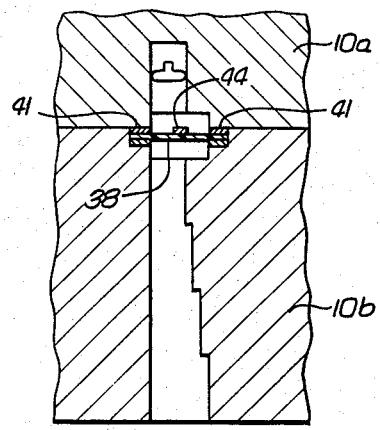
FIG. 3 is an enlarged fragmentary sectional view taken substantially along the line 3—3 of FIG. 2.
Figure 5:
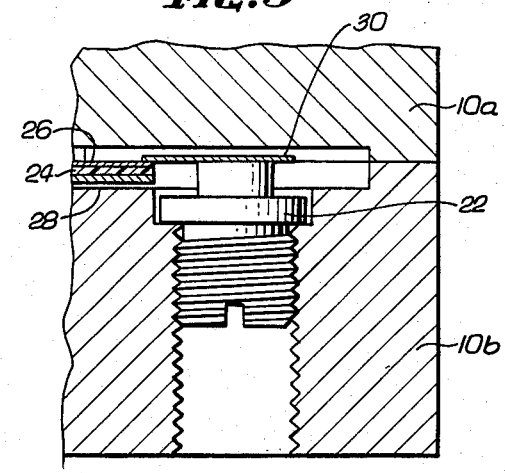
FIG. 5 is an enlarged fragmentary sectional view taken substantially along the line 5—5 of FIG. 2.

The microstrip section 14 extends along the channel 16 to a transition point indicated by reference numeral 36 (FIGS. 2 and 4). At the transition point, there is an electrical interface with the suspended stripline section 12, as best shown in FIG. 4. Basically, the suspended stripline section 12 slightly overlaps the microstrip section 14. The suspended stripline has a substrate 38 of dielectric material and, in the region of the transition point 36, has a central conductive strip 40 on its underside. The conductive strips 40 and 26 are placed in contact at the transition point 36, and are secured by solder or other means. The suspended stripline section 12 also has a thin metallic strip along each of the edges of the its upper and bottom face, as indicated at 41.

The conductive strip 40 of the suspended stripline section 12 terminates to form part of a broadside coupler, indicated at 42. The coupler 42 also includes another conductive strip 44 on the upper face of the substrate 38. The two conductive strips 40 and 44 overlap by a selected distance on opposite faces of the substrate 38. Preferably, the overlap distance is about a quarter wavelength, although this distance can be adjusted to provide a desired degree of coupling from one strip to the other. The coupler 42 acts basically as a high-pass filter. The rf energy from the local oscillator 22 is easily transmitted across the coupler, but direct current is completely isolated, to prevent dc from the local oscillator circuit from being coupled to the mixer.

The narrow central conductive strip 44 of the suspended microstrip section 12 crosses an rf waveguide 48 formed in the lower half 10b of the housing block. The waveguide 48 is formed as a rectangular passage extending through the block half 10b from the channel 16b, in a direction perpendicular to the plane of the channel 16. An incoming rf signal is coupled into the waveguide 48, which terminates at a region 50 where mixing of the rf signal and the LO signal takes place. The region 50 operates as a crossbar stripline structure, and includes two beamlead diodes, shown diagrammatically at 52 and connected in series across the broadwall of the waveguide 48. The diodes 52 may, for example, be part number DMK6606 made by Alpha Industries, Inc., of Woburn, Mass. The mixing operation generates an intermediate-frequency signal that propagates further along the stripline structure 12, through a conventional matching transfer 54, and through a series of widened portions 56 constituting a conventional low-pass filter to remove the higher-frequency components resulting from the mixing process.

The position of the coupler 42 with respect to the diodes 52 and the mixing region 50 is selected to present an open-circuit or very high impedance to intermediate-frequency signals generated in the mixing region 50. Ideally, there should be an open-circuit condition both at the diodes 52 and at the coupler 42. Intermediate-frequency signals are then prevented from being transmitted back toward the Gunn diode 22 and have the maximum voltage strength at the diode location.

The assembly also includes a block of dielectric material 60 secured to the microstrip section 14 spaced slightly from the conductive strip 26 and supported by the substrate 24. The dielectric material is selected to have a temperature coefficient opposite that of the Gunn diode 22. In the preferred embodiment, a square block of barium tetratitanate is used.

Using the dielectric material 60 for temperature compensation, it is possible to achieve a frequency stability represented by a temperature coefficient of 0.1 MHz (megahertz) per degree C (centigrade). Even without the dielectric material for temperature compensation, the frequency output of the oscillator 22 can be stabilized to within 1.1 MHz/degree C due to the stub resonator, which is a significant improvement over a typical figure of 2 MHz/degree C for conventional waveguide cavity oscillators.

Figure 6:
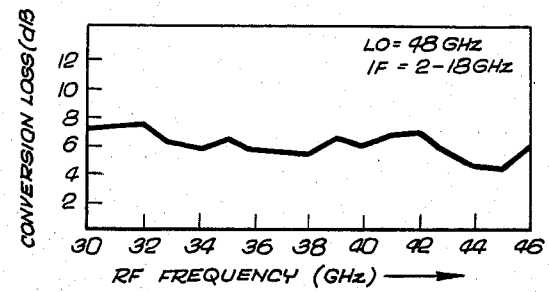
FIGS. 6 and 7 are graphs showing the conversion loss performance of the assembly of the invention, measured in the Q frequency band and the K frequency band, respectively.
Figure 7:
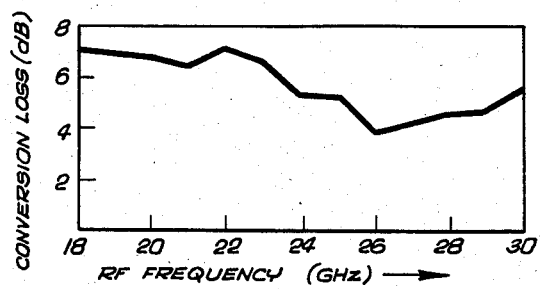

The performance of the assembly in terms of conversion loss in decibels (dB) versus frequency, is shown in FIGS. 6 and 7 for two different ranges of frequency. For the FIG. 6 case, the local oscillator frequency is 48 GHz (gigahertz), and the conversion loss over the frequency range of 30-46 GHz is never much higher than 7 dB. Similar performance is shown in FIG. 7 for the frequency range 18-30 GHz, using a local oscillator frequency of 32 GHz. The intermediate-frequency range for the FIG. 6 case is 2-18 GHz, and for the FIG. 7 case is 2-14 GHz. For narrowband applications, a conversion loss of less than 5 dB has been achieved over a bandwidth of 3-4 GHz. For example, FIG. 7 shows a conversion loss of less than 5 dB over the range 24-29 GHz.

It will be appreciated from the foregoing that the present invention represents a significant advance in the field of rf mixers and local oscillators. In particular, the invention provides an assembly including both a mixer and a local oscillator in one integrated housing block of extremely compact proportions, approximating one cubic inch in volume. Moreover, the assembly of the invention provides good frequency stability in varying temperature conditions without the use of bulky and expensive phase-lock loop circuitry, and provides good conversion loss performance over a relatively wide bandwidth. It will also be appreciated that, although a specific embodiment of the invention has been described in detail for purposes of illustration, various modifications may be made without departing from the spirit and scope of the invention. Accordingly, the invention is not to be limited except as by the appended claims.

We claim:

1. A radio-frequency (rf) mixer and local oscillator assembly, comprising:
 a conductive housing having an integral rf input waveguide;
 oscillator means installed in the housing;
 an rf mixer installed in the same housing and located in the rf input waveguide, for coupling an input rf signal directly to the mixer;
 transmission line means coupled to the oscillator means and to the mixer, for transmitting a local oscillator (LO) signal from the oscillator means to the mixer; whereby the mixer and oscillator means are integrated into a single compact assembly.
 an intermediate-frequency output line from the mixer, including low-pass filter means, the output line and low-pass filter means also being integrated into the same housing.

2. An assembly as set forth in claim 1, wherein the transmission line means includes:
 a microstrip transmission line section extending from the oscillator means to a transition point; and
 a suspended stripline section extending from the transition point to the rf mixer.

3. An assembly as set forth in claim 2, wherein:
 the oscillator means includes a Gunn-type diode; and
 the transmission line means further includes a broadside coupler in the suspended stripline section, wherein the coupler includes overlapping portions of conductive strips on opposite faces of the stripline, whereby the coupler serves to isolate the mixer from a bias voltage used for the Gunn-type diode and to prevent intermediate-frequency signals from propagating toward the Gunn-type diode.

4. An assembly as set forth in claim 1, wherein:
 the oscillator means includes a Gunn-type diode; and
 the assembly further includes a block of dielectric material installed near the Gunn-type diode and having a temperature coefficient opposite that of the Gunn-type diode, to compensate for temperature-induced changes in frequency.

5. An assembly as set forth in claim 2, wherein:
 the oscillator means includes a Gunn-type diode; and
 the assembly further includes a block of dielectric material installed near the Gunn-type diode and having a temperature coefficient opposite that of the Gunn-type diode, to compensate for temperature-induced changes in frequency.

6. An assembly as set forth in claim 3, and further including:
 a block of dielectric material installed near the Gunn-type diode and having a temperature coefficient opposite that of the Gunn-type diode, to compensate for temperature-induced changes in frequency.

7. An assembly as set forth in claim 1, wherein:
 the oscillator means includes a Gunn-type diode; and
 the assembly further includes a stub resonator installed at the Gunn-type diode for increased frequency stability.

8. An assembly as set forth in claim 2, wherein:
 the oscillator means includes a Gunn-type diode; and
 the assembly further includes a stub resonator installed at the Gunn diode for increased frequency stability.

9. An assembly as set forth in claim 3, and further including:
 a stub resonator installed at the Gunn diode for increased frequency stability.

10. A radio-frequency (rf) mixer and local oscillator assembly, comprising:
 a conductive housing having an integral rf input waveguide;
 a Gunn-type diode oscillator installed in the housing;
 an rf mixer installed in the same housing and located in the rf input waveguide, for coupling an rf input signal directly to the mixer;
 a section of microstrip transmission line extending from the Gunn-type diode to a transition point, for carrying rf energy from the Gunn-type diode;
 means coupled to the microstrip section for applying a bias voltage to the Gunn-type diode;
 a stub resonator positioned near the Gunn-type diode to improve frequency stability;
 a block of dielectric material located on the microstrip section near the Gunn-type diode and having a temperature coefficient opposite that of the Gunn-type diode, to compensate for the effect of temperature variations on the diode;
 a section of suspended stripline electrically connected to the microstrip section at the transition point, to carry rf energy to the mixer;
 a broadside coupler formed as part of the section of suspended stripline, the coupler including overlapping portions of conductive strips on opposite faces of the suspended stripline, whereby the coupler isolates the mixer from the Gunn-type diode bias voltage and isolates the Gunn-type diode from intermediate-frequency signals generated in the mixer; and an intermediate-frequency output line from the mixer, including low-pass filter means, the output line and low-pass filter means also being integrated into the same housing.

11. An assembly as set forth in claim 10, wherein: the mixer also includes two diodes connected in series across the input rf waveguide.

* * * * *